United States Patent
Kuroda et al.

(10) Patent No.: US 7,339,711 B2
(45) Date of Patent: Mar. 4, 2008

(54) ANGLE-MULTIPLEXING HOLOGRAM RECORDING DEVICE, METHOD, HOLOGRAM REPRODUCTION DEVICE, AND METHOD

(75) Inventors: Kazuo Kuroda, Saitama (JP); Satoshi Sugiura, Saitama (JP); Shuuichi Yanagisawa, Saitama (JP); Satoru Tanaka, Saitama (JP); Yoshihisa Itoh, Saitama (JP); Akihiro Tachibana, Saitama (JP); Yoshihisa Kubota, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/514,627

(22) PCT Filed: May 19, 2003

(86) PCT No.: PCT/JP03/06207

§ 371 (c)(1),
(2), (4) Date: Jan. 20, 2006

(87) PCT Pub. No.: WO03/098362

PCT Pub. Date: Nov. 27, 2003

(65) Prior Publication Data

US 2006/0109535 A1 May 25, 2006

(30) Foreign Application Priority Data

May 17, 2002 (JP) .............................. 2002-143771

(51) Int. Cl.
*G11B 7/00* (2006.01)

(52) U.S. Cl. .............................. 359/24; 359/12; 359/30

(58) Field of Classification Search .................. 359/12, 359/24, 30, 35
See application file for complete search history.

(56) References Cited

U.S. PATENT DOCUMENTS 6,317,404 B1 * 11/2001 Kawano et al. ............. 369/103
2003/0039001 A1 * 2/2003 King et al. ................... 359/35

FOREIGN PATENT DOCUMENTS

| JP | 4-93881 | 3/1992 |
|---|---|---|
| JP | 2000-284671 | 10/2000 |
| JP | 2001-118253 | 4/2001 |
| JP | 2001-118254 | 4/2001 |

OTHER PUBLICATIONS

Microfilm of the specification and drawings annexed to the request of Japanese Utility Model Application No. 16724/1975 (Laid-open No. 98558/1976) (NEC Corp.), Aug. 7, 1976, Full text; all drawings (Family: none).

* cited by examiner

*Primary Examiner*—Fayez G. Assaf
(74) *Attorney, Agent, or Firm*—Young & Thompson

(57) ABSTRACT

A hologram recording apparatus (100) includes a record angle change device (19) capable of relatively changing the record angle of a hologram recording medium (200) relative to signal light (L3) and reference light (L2); and a control device (18). The control device sets a record angle for recording a specific angle record plane as a standard record angle among a plurality of angle record planes on the hologram recording medium. Furthermore, the control device controls the record angle change device so as to change and fix the record angle after then by a predetermined angle from the set standard record angle.

13 Claims, 5 Drawing Sheets

ANGLE-MULTIPLEXING HOLOGRAM RECORDING DEVICE, METHOD, HOLOGRAM REPRODUCTION DEVICE, AND METHOD

TECHNICAL FIELD

The present invention relates to a hologram recording apparatus for and method of irradiating a hologram recording medium with signal light via a spatial light modulator to recording information and a hologram reproduction apparatus for and method of reproducing the information from the hologram recorded medium. Particularly, it relates to an angle-multiplex type hologram recording apparatus for and method of, as well as a hologram reproduction apparatus for and method of, recording different record informations overlappingly in the same area by relatively changing angles of the signal light and reference light relative to a surface of the hologram recording medium, and then reproducing the multiplex-recorded information.

BACKGROUND ART

Heretofore, a hologram recording apparatus, which may be provided with a liquid crystal device and the like, irradiates a spatial light modulator for modulating light depending on record information to be recorded, with laser light as signal light. Particularly, in the spatial light modulator, cells are arranged planarly in a matrix so that the signal light is modulated by changing transmittance of each cell depending on the record information. Furthermore, the modulated signal light is outputted with different output angles, as a plurality of diffraction light, such as 0th-order light, or 1st-order light and so on, due to diffraction phenomenon in the cell having a fine pitch. In this case, the output angle is defined by the cell pitch, which indicates an modulation unit. Then, the signal light modulated with the spatial light modulator constructed as above and reference light not passed through the spatial light modulator are interfered on the hologram recording medium. Thereby, the recording information is recorded as a wavefront on the hologram recording medium.

An angle-multiplex type hologram recording apparatus is proposed for multiplex recording different information in the same area, by changing little by little a surface angle of the hologram recording medium relative to the reference light and the signal light, particularly during recording. In the present application, the angle of the signal light relative to the hologram recording medium surface in such an angle-multiplex type recording is referred to as a "record angle" as appropriate. Furthermore, an angle as a standard of the record angle, such as the record angle when it corresponds to a normal line of the hologram recording medium surface, is referred to as a "standard record angle". Still further, in the present application, each record plane corresponding to each record angle is referred to as an "angle record plane", and a record plane corresponding to the standard record angle is referred to as a "standard angle record plane".

On the other hand, a hologram reproduction apparatus consisting a pair with the hologram recording apparatus is designed to reproduce the recorded multiplex information in the same area, by changing little by little the surface angle of the hologram recording medium relative to the reproduction illumination light. In the present application, the angle of the reproduction light relative to the hologram recording medium surface in such an angle-multiplex type reproduction is referred to as a "reproduction angle" as appropriate. Furthermore, an angle as a standard of the reproduction angle, such as the reproduction angle when it corresponds to a normal line of the hologram recording medium, is referred to as a "standard reproduction angle".

In the angle-multiplex type hologram recording apparatus, recording to each angle record plane in the same record area are successively performed for each record angle, by changing the record angle in the maximum range with increment or decrement 0.01 degree from the standard record angle (e.g. by changing little by little in the range of 88-92 degree). Incidentally, in the present application, an area on the hologram recording medium surface onto which the signal light and the reference light are irradiated together is referred to as a "record area". In the angle-multiplex type recording, a plurality of angle record planes such as 50 planes is recorded in the same record area.

On the other hand, in the angle-multiplex type hologram reproduction apparatus, the recorded multiplex information in the same area is reproduced for each reproduction angle, by changing little by little the reproduction angle from the standard reproduction angle in response to the record angle.

Thus, in the angle-multiplex type hologram recording apparatus and hologram reproduction apparatus, the record information can be recorded respectively on a plurality of angle record planes recorded for each record angle in the same record area, and the recorded information can be reproduced respectively. Therefore, recording density and recording capacity are expected to be remarkably increased.

DISCLOSURE OF INVENTION

However, generally in the hologram recording, angle selectivity is very high. For this, in the case that the recording (additional recording, tsui-ki) or reproduction is performed to the same hologram recording medium (e.g. a removable recording medium) by means of different pieces of the hologram recording apparatus, hologram record/reproduction apparatus or hologram reproduction apparatus in the same type, the set condition or mechanical state of the optical system, the mechanism for fixing the hologram recording medium according to the aforementioned standard record angle or standard reproduction angle, or the like, is not always the same in each apparatus, because of variations among pieces. For example, depending on variations among pieces, the standard angle record plane recorded as correspondent to the standard record angle in one apparatus does not actually correspond to the set condition or mechanical state of the optical system, the mechanism and the like expected to correspond to the standard record angle and standard reproduction angle in another apparatus. That is, under such a mechanical state or set condition, another angle record plane different from the standard angle record plane may be adversely recognized as the standard angle record plane. Alternatively, because of mis-recognizing the standard angle, the recording may be adversely performed to the angle record plane different from the to-be-recorded (additionally recorded) angle record plane, the angle record plane different from the to-be-reproduced angle record plane may be adversely reproduced, otherwise the reproduction becomes impossible due to the non-correspondence between the record angle and the reproduction angle.

The present invention has been accomplished in view of above problems. It is therefore an object of the present invention to provide a hologram recording apparatus and method, as well as a hologram reproduction apparatus and method, capable of improving the record density and the record capacity, and capable of performing the recording operation or reproduction operation accurately and quickly.

In order to solve the above problems, an angle-multiplex type hologram recording apparatus of the present invention is provided with a light source for performing an irradiation with source light including signal light and reference light; a spatial light modulator disposed in an optical path of the signal light, for modulating the signal light; an optical system for introducing the signal light passed through the spatial light modulator and the reference light onto a hologram recording medium; a record angle change device for relatively changing a record angle of the hologram recording medium relative to the signal light and the reference light; and a control device for controlling the record angle change device to set the record angle when a specific angle record plane is recorded from among a plurality of angle record plane s on the hologram recording medium as a standard record angle, and to change and fix the record angle after then by a predetermined angle from the set standard record angle.

According to the hologram recording apparatus of the present invention, during the operation, the record light source such as the semiconductor laser device performs the irradiation with the source light such as laser light. The source light includes the signal light and the reference light. Here, the spatial light modulator, consisting of a liquid crystal device or the like for example, disposed in the optical path of the signal light, modulates the signal light. Then, the optical system introduces the modulated signal light and the reference light onto the hologram recording medium. As the result, the record information is recorded as a wavefront onto the hologram recording medium, due to the interference between the signal light and the reference light.

Incidentally, the signal light and the reference light included in the source light may be split from each other by the optical system such as a beam splitter and then the signal light may be introduced to enter the spatial light modulator and the reference light may be introduced not to enter the spatial light modulator. Alternatively, the signal light and the reference light included in the source light may be introduced to enter the spatial light modulator without split from each other. In the latter case, Fourier 0th-order component of the signal light outputted from the spatial light modulator may be functioned as the reference light, for example by employing a so-called "self-coupling scheme". In this case, the reference light may not have the phase information.

Particularly in this case, the control device sets, as the standard record angle, the record angle when a specific angle record plane such as the first angle record plane is recorded. Then, the record angle change device changes and fixes the record angle, after the specific angle record plane is recorded, by a predetermined angle on the basis of the set standard record angle, under control of the control device. Therefore, it is possible to coincide the standard record angle defined by the set condition or mechanical state of the optical system, the record angle change device and the like at the hologram recording apparatus side, with the standard record angle at the hologram recording medium side, at a specific time point in the recording such as the first time of the recording or the like. That is, even in the case that they are used for different hologram recording apparatuses of the same type, it is possible to coincide them with each other at a specific time point in the recording for each hologram recording apparatus independent of variations among pieces. Furthermore, after then, the recording can be performed accurately to the angle record plane for any record angle, on the basis of the standard record angle set at the specific time point for each hologram recording apparatus.

Here, for a comparison, it is assumed a case that the actual recording (additional recording) or reproduction is performed after confirming that the recording (additional recording) or reproduction is to be performed to any angle record plane every time when the angle is changed, by recording in advance the angle information indicating the record angle for each angle record plane and by referring to the angle information when the recording (additional recording) or reproduction is performed. In this case, since the task for confirming which angle record plane is caused every time when the record angle is changed, a quick record operation is difficult. The record capacity for the desired record information, such as contents information, to be actually recorded is reduced, because the angle information and the like are recorded.

On the contrary, the hologram recording apparatus of the present invention allows the subsequent quick angle change and the record operation, on the basis of the standard record angle set at the specific record time.

Thus, according to the present invention, the angle-multiplex system remarkably improves the record density and the record capacity and further allows performing the angle-multiplex type recording accurately independent of variations among pieces, as well as performing record operation quickly.

Incidentally, in the present invention, the spatial light modulator may perform binary modulation depending on binary data indicated by the record information.

Thereby, the record information indicating the binary data can be recorded at high density onto the hologram recording medium. Alternatively, multi-level modulation may be performed depending on gray scale data indicated by the record information. Thereby, the record information indicating the gray scale data can be recorded at high density onto the hologram recording medium.

Furthermore, in the present invention, the modulated signal light outputted from the spatial light modulator comprising at least one of the diffraction 0th-order light and the diffraction L-order light (L is natural number not less than 1). For example, the hologram recording at high density can be performed by using only the 0th-order light from among the diffraction light, or using the 0th-order light and one or more higher-order lights such as the 1st-order light.

Additionally, at least one of reference light phase-code-multiplex system for performing multiplex-recordings with various phases of the reference light, reference light amplitude-multiplex system for performing multiplex-recordings with various amplitudes of the reference light, reference light polarization-multiplex system for performing multiplex-recordings with various polarizations of the reference light, and focal-depth-multiplex system for performing multiplex-recordings with various focal depths of the signal light entering the hologram recording medium may be combined to the aforementioned angle-multiplex type hologram recording apparatus of the present invention. Thereby, a hologram recording at still higher density is performable.

In an aspect of the angle-multiplex type hologram recording apparatuses according to the present invention, the spatial light modulator records angle standard identification information indicating a standard angle record plane corresponding to the standard record angle onto the specific angle record plane, if the hologram recording medium is not recorded.

According to this aspect, if the hologram recording medium is not recorded, the spatial light modulator records the angle standard identification information to the specific angle record plane. Therefore, then, on the basis of the angle standard identification information, it can be easily recognized that the standard record angle is already set to the hologram recording medium and it can be identified which angle record plane is the standard angle record plane regardless of the difference among the hologram recording apparatuses.

In another aspect of the angle-multiplex type hologram recording apparatus according to the present invention, the control device calibrates the record angle change device on the basis of the angle standard identification information, if record information has been recorded at least on the specific angle record plane of the hologram recording medium.

According to this aspect, in the case that the record information is recorded to another angle record plane after the recording is performed to the specific angle record plane, the control device firstly calibrates the record angle change device on the basis of the angle standard identification information. More specifically, for example, the record angle change device detects the angle difference between the angle record plane corresponding to the set condition of the optical system, mechanical state or the like of the record angle change device at the present recording expected to correspond to the standard record angle, and the standard angle record plane indicated by the angle standard identification information, and then offsets by the detected angle difference to change the record angle. Thereby, the record information can be recorded (additionally recorded) accurately for any angle record plane, because the changes, such as the time-lapse change of the set condition of the optical system, the mechanical state or the like, the change in the setting angle or the loading of the hologram recording medium, are calibrated by the offset, even if the changes are significantly big relative to the angle selectivity of the hologram recording medium.

Alternatively, in another aspect of the angle-multiplex type hologram recording apparatus according to the present invention, angle standard identification information indicating standard angle record plane corresponding to the standard record angle is recorded onto at least one of a plurality of angle record plane s of the hologram recording medium, and the control device calibrates the record angle change device on the basis of the angle standard identification information.

According to this aspect, in the case that the recording is performed to the hologram recording medium having the angle record plane for which the recording is already performed and the angle standard identification information is recorded, the control device calibrates the record angle change device on the basis of the angle standard identification information. More specifically, for example, the record angle change device detects the angle difference between the standard angle record plane indicated by the angle standard identification information and the angle record plane corresponding to the set condition of the optical system, the mechanical state or the like expected to correspond to the standard record angle of the record angle change device at the present recording, and then offsets by the detected angle difference, to change and fix the record angle. Thereby, the record information can be recorded (additionally recorded) accurately by means of the hologram recording apparatus for the present recording, because the changes are offset even if the set condition of the optical system, mechanical state or the like of the record angle change device is not the same between the hologram recording apparatus for the present recording and another hologram recording apparatus for the first recording to the standard angle plane.

In another aspect of the angle-multiplex type hologram recording apparatus according to the present invention, the apparatus further comprises a move device for moving the hologram recording medium relative to a focus position of the reference light and the signal light introduced by the optical system.

According to this aspect, the move device relatively moves the hologram recording medium, when the recording to one or more angle record planes by angle-multiplex system in one record area onto which the signal light and the reference light are focused is completed. Thereby, the signal light and the reference light are focused onto another record area, and the recording is similarly performed to a plurality of angle record planes for another record area.

In this aspect, it may be arranged that the spatial light modulator performs recording to all angle record planes of the hologram recording medium every time of moving by the move device.

In this arrangement, the number of times or displacement for the moving by the move device can be restricted to the small extent. Furthermore, the changes in the set condition of the mechanical state of the optical system, the record angle change device and the like, which may be caused by the displacement by the move device, can be restricted to the minimum extent.

Incidentally, the move device may perform the moving, before the recording to all the angle record planes in one record area is completed. Alternatively, the move device may perform the moving, every time when the recording to one angle record plane in one record area is completed.

In another aspect of the angle-multiplex type hologram recording apparatus according to the present invention, the specific angle record plane is a first angle record plane to be firstly recorded from among the plurality of angle record planes.

According to this aspect, the record angle when the first angle record plane of the hologram recording medium is recorded is set as the standard record angle. Therefore, the recording can be performed accurately to the angle record plane for any record angle, on the basis of the standard record angle set at the first recording.

In order to solve the above problems, a hologram reproduction apparatus of the present invention is the apparatus for reproducing recorded information from an angle-multiplex type hologram recording medium in which angle standard identification information indicating a standard angle record plane is recorded onto one of a plurality of angle record planes, is provided with: a light source for irradiating the hologram recording medium with reproduction illumination light; a photoreceptor for receiving reproduction light based on the reproduction illumination light from the hologram recording medium; a read device for reading respectively the plurality of record information overlappingly recorded onto the hologram recording medium, on the basis of the received reproduction light; a reproduction angle change device for changing a reproduction angle of the hologram recording medium relative to the reproduction illumination light; and a control device for controlling the reproduction angle change device so as to change and fix the reproduction angle by a predetermined angle on the basis of standard reproduction angle corresponding to the standard angle record plane, wherein the control device calibrates the reproduction angle change device on the basis of the angle standard identification information.

According to the angle-multiplex type hologram reproduction apparatus of the invention, during the operation, the light source such as the semiconductor laser irradiates the reproduction illumination light such as laser beam. Then, the photoreceptor, including a photodiode array, a CCD (Charge Coupled Device) and the like, receives the reproduction light based on the reproduction illumination light from the hologram recording medium. The "reproduction light" herein means the 0th-order light or the higher-order light such as the 1st-order light, caused when the reproduction illumination light corresponding to the reference light for the recording is irradiated onto the hologram recording medium. Then, on the basis of the reproduction light received by the photoreceptor, the read device reads, for each angle record plane, a plurality of record information recorded onto each record plane.

Particularly in this case, the control device calibrates the reproduction angle change device on the basis of the angle standard identification information read from the hologram recording medium. Then, the reproduction angle change device changes and fixes each reproduction angle by a predetermined angle on the basis of the standard reproduction angle, under control of the control device. More specifically, for example, the reproduction angle change device detects the angle difference between the angle record plane corresponding to the set condition of the optical system, the mechanical state or the like expected to correspond to the standard reproduction angle of the reproduction angle change device at the present reproduction, and the standard angle record plane indicated by the angle standard identification information. Then, the reproduction angle change device offsets by the detected angle difference to change and fix the reproduction angle. Thereby, the recorded information can be reproduced accurately by means of the hologram reproduction apparatus for the present reproduction, because the change is calibrated by the offset even if the set condition of the optical system, the mechanical state or the like of the reproduction angle change device and the record angle change device is not the same among the hologram reproduction apparatus for the present record and another apparatus used for the first recording onto the standard angle record plane.

For a purpose of comparison, it is assumed a case that the angle information indicating the record angle is recorded in advance onto the hologram recording medium for each angle record plane, and it is confirmed which angle record plane is to be performed every time when the angle is changed, with reference to firstly the angle information when the reproduction is performed for each angle record plane, and then the reproduction is actually performed. In this case, sine the operation for confirming which angle record plane is caused every time when the reproduction angle is changed, it is difficult to perform the reproduction operation quickly.

On the contrary, the hologram reproduction apparatus of the present invention performs the calibration on the basis of the angle standard identification information and allows the subsequent prompt angle change and the prompt reproduction operation.

Thus, according to the present invention, the record density and the record capacity can be remarkably improved due to the angle-multiplex system, and the angle-multiplex type reproduction is performable accurately regardless of variations among apparatuses, and the quick reproduction operation is also allowed.

Additionally, at least one of reference light phase-code-multiplex system for performing multiplex-recordings with various phases of the reference light, reference light amplitude-multiplex system for performing multiplex-recordings with various amplitudes of the reference light, reference light polarization-multiplex system for performing multiplex-recordings with various polarizations of the reference light and focal-depth-multiplex system for performing multiplex-recordings with various focal depths of the signal light entering the hologram recording medium may be incorporated into the aforementioned angle-multiplex type hologram reproduction apparatus of the present invention. Thereby, the hologram reproduction can be performed at still higher density.

In another aspect of the hologram reproduction apparatus according to the present invention, the apparatus further comprises: a move device for moving the hologram recording medium relative to a focus position of the reproduction illumination light.

According to this aspect, when the reproduction to one or more angle record planes is completed by the angle-multiplex system, for one record area onto which the reproduction illumination light is focused, the move device relatively moves the hologram recording medium. Thereby, the reproduction illumination light is focused onto another record area, and the reproduction is similarly performed to a plurality of angle record planes for said another record area.

In this aspect, it may be arranged that the read device performs reproduction to all angle record planes of the hologram recording medium, every time of moving by the move device.

In this arrangement, the number of times or displacement for the moving by the move device can be restricted to the small extent. Furthermore, the changes in the set condition of the mechanical state of the optical system, the reproduction angle change device and the like, which may be caused by the displacement by the move device, can be restricted to the minimum extent.

Incidentally, the move device may perform the moving, before the reproduction is completed for all the angle record planes in one record area. Alternatively, the move device may perform the moving, every time when the reproduction is completed to one angle record plane in one record area.

In order to solve the above problems, a hologram recording method of the present invention is the method of recording information on a hologram recording medium in an angle-multiplex type hologram recording apparatus comprising: a light source for performing an irradiation with source light including signal light and reference light; a spatial light modulator disposed in an optical path of the signal light, for modulating the signal light; an optical system for introducing the signal light passed through the spatial light modulator and the reference light onto the hologram recording medium; and a record angle change device for relatively changing a record angle of the hologram recording medium relative to the signal light and the reference light. The method is provided with: a set process of setting the record angle when a specific angle record plane from among a plurality of angle record planes of the hologram recording medium is recorded, as a standard record angle; and a control process of controlling the record angle change device so as to change and fix the record angle after then by a predetermined angle from the set standard record angle.

According to the angle-multiplex type hologram recording method, similarly to the aforementioned hologram recording apparatus of the present invention, the record density and the record capacity can be remarkably improved by the angle-multiplex system, and the angle-multiplex type recording can be performed accurately regardless of variations among apparatuses, and the quick record operation is also allowed.

In an aspect of the angle-multiplex type hologram recording method according to the present invention, the specific angle record plane is a first angle record plane to be firstly recorded from among the plurality of angle record planes.

According to this aspect, the record angle when the first angle record plane of the hologram recording medium is recorded is set as the standard record angle. Therefore, the recording can be performed accurately to the angle record plane for any record angle, on the basis of the standard record angle sot at the first recording.

In order to solve the above problems, an angle-multiplex type hologram reproduction method of the present invention is the method of reproducing recorded information from an angle-multiplex type hologram recording medium in an angle-multiplex type hologram reproduction apparatus for reproducing the recorded information from the angle-multiplex type hologram recording medium in which angle standard identification information indicating a standard angle record plane is recorded onto one of a plurality of angle record planes, said reproduction apparatus comprising: a light source for irradiating the hologram recording medium with reproduction illumination light; a photoreceptor for receiving reproduction light based on the reproduction illumination light from the hologram recording medium; a read device for reading respectively the plurality of record information overlappingly recorded onto the hologram recording medium, on the basis of the received reproduction light; and a reproduction angle change device for changing a reproduction angle of the hologram recording medium relative to the reproduction illumination light. The method is provided with: a calibration process of calibrating the reproduction angle change device on the basis of the angle standard identification information; and a control process of controlling the reproduction angle change device so as to change and fix the reproduction angle by a predetermined angle on the basis of standard reproduction angle corresponding to the standard angle record plane.

According to the angle-multiplex type hologram reproduction method of the present invention, similarly to the aforementioned hologram reproduction apparatus, the record density and the record capacity can be remarkably improved by the angle-multiplex system, and the angle-multiplex type reproduction can be performed accurately regardless of variations among apparatuses, and the quick reproduction operation is also allowed The above effects and other advantages of the present invention will be more apparent from the following explanation.

BEST MODE FOR CARRYING OUT THE INVENTION

Now, embodiments of the present invention will be explained, with reference to drawings.

First Embodiment of Hologram Recording Apparatus

The first embodiment of the hologram recording apparatus of the present invention will be discussed, with reference to FIG. 1 to FIG. 3.

Firstly, with reference to FIG. 1 and FIG. 2, the entire configuration of the hologram recording apparatus of the present invention will be discussed. FIG. 1 illustrates the entire configuration of the hologram recording apparatus of the present invention. FIG. 2 illustrates schematically and perspectively the spatial light modulator employed in the embodiment.

Figure 1:
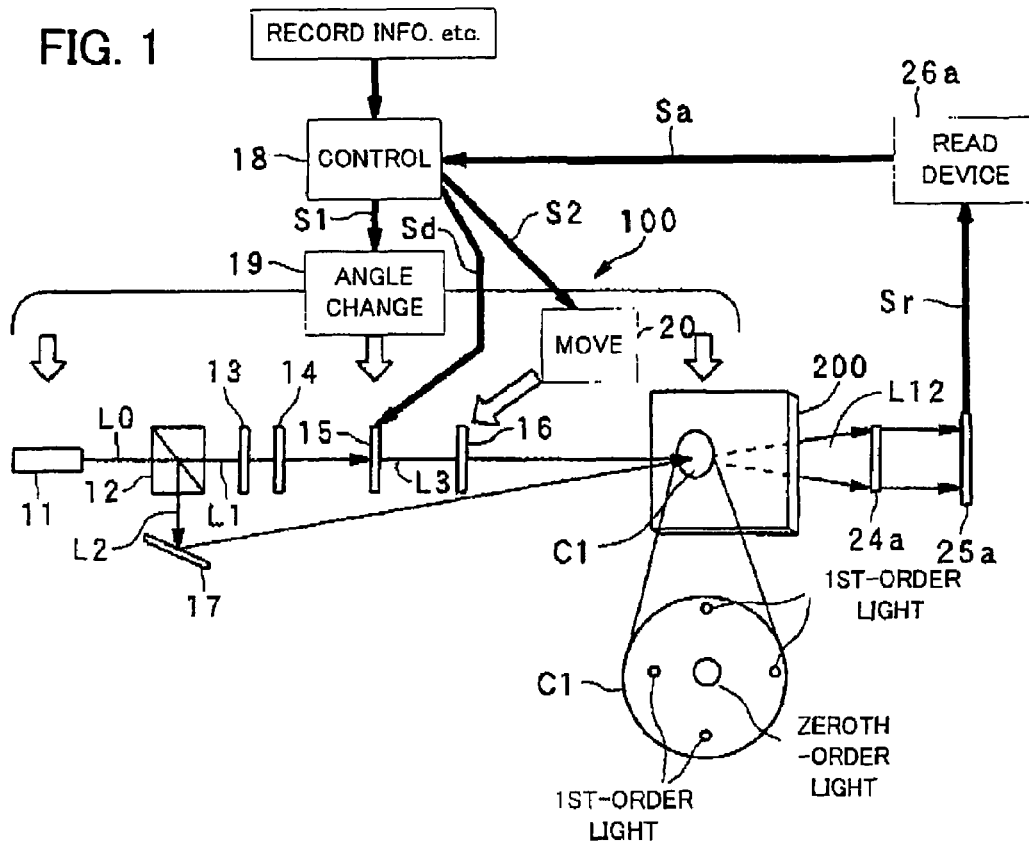
FIG. 1 is a block diagram illustrating an entire configuration of the first embodiment of the hologram recording apparatus of the present invention.

As shown in FIG. 1, the hologram recording apparatus 100 in this embodiment is provided with: a laser device 11 as one example of the light source for emitting the source light L0 made of laser beam; a beam splitter 12 as one example of the optical system for splitting the source light L0 into the signal light L1 and the reference light L2; a lens 13 as one example of the enlarge optical system disposed in an optical path of the signal light L1, for enlarging a diameter of the signal light L1; a lens 14 such as a collimator lens for converting the signal light L1 outputted from the lens 13 into an approximately parallel light; a spatial light modulator 15 for modulating the signal light L1 outputted from the lens 14 in response to the recording signal to be recorded and for outputting the modulated light as the modulated signal light L3; and a lens 16 as one example of the demagnifying optical system for reducing a diameter of the signal light L3 and outputting narrowed signal light onto the hologram recording medium 200.

The hologram recording apparatus 100 is further provided with: a mirror 17 as one example of the optical system for introducing the reference light L2 split by the beam splitter 12 onto the hologram recording medium 200, at the focus position where the signal light L3 corresponding to the reference light L2 is focused.

Incidentally, in FIG. 1, a surface part C1 of the hologram recording medium 200 onto which the signal light L3 including the 0th-order light and four 1st-order lights diffracted by the spatial light modulator 15 is focused is enlarged.

Figure 2:
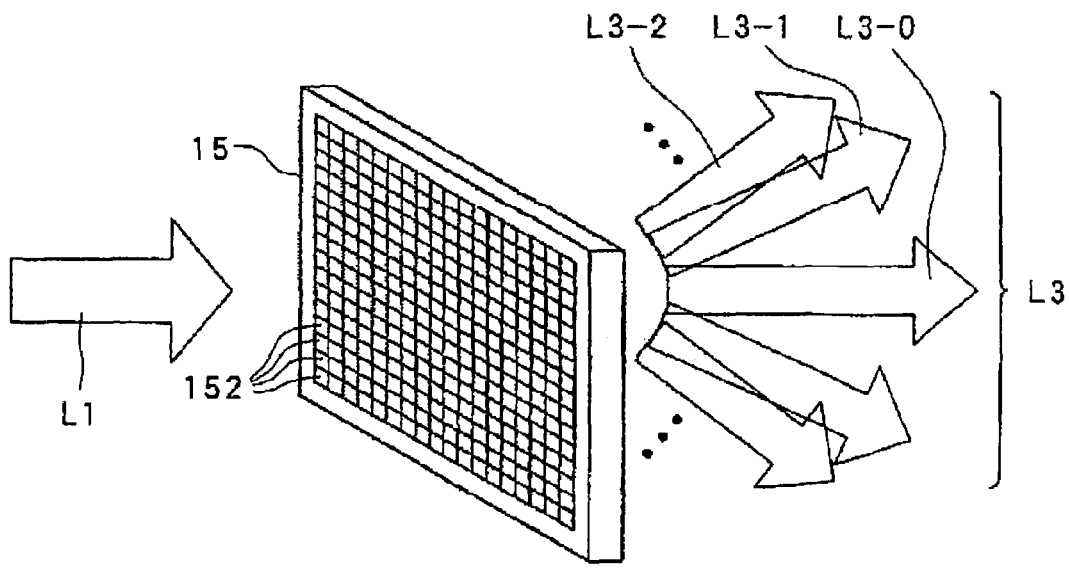
FIG. 2 is a perspective view schematically illustrating the spatial light modulator employed in the first embodiment.

As shown in FIG. 2, the spatial light modulator 15 is made of, for example, a liquid crystal device, and divided into a plurality of cells 152. The cell 152 is the unit of the modulation. The spatial light modulator 15 can perform the modulation in each cell 152. For example, if the spatial light modulator 15 is an active matrix drive type liquid crystal device, the plurality of cells 152 is defined in response to a plurality of pixel electrodes two-dimensionally arrayed in a matrix. If the signal light L1 is introduced, the spatial light modulator 15 outputs the signal light L3 made of the modulated diffraction light including the 0th-order diffraction light L3-0 and the higher order diffraction light such as the 1st-order diffraction light L3-1, the 2nd-order diffraction light L3-2, . . . , due to the diffraction depending on a size of the cell 152.

In FIG. 1 again, the hologram recording apparatus 100 is further provided with: a record angle change device 19 for changing little by little and fixing the angles of the signal light L3 and the reference light L2 relative to the surface of the hologram recording medium 200; and a control device 18 for controlling the record angle change device 19 so that the signal light L3 has the record angle corresponding to the angle record plane where the recording is performed on the hologram recording medium 200. Incidentally, in this embodiment, an angle formed by an optical axis of the signal light L3 and the surface of the hologram recording medium 200 is defined as a "record angle".

The record angle change device 19 has the function of changing relatively the record angle of the signal light L3 relative to the surface of the hologram recording medium 200. The function can be achieved, for example, by changing the angles or positions of the constitutional elements in the optical system, such as the laser device 11; the beam splitter 12; the lenses 13, 14 and 16; and the spatial light modulator 15, relative to each optical axis. Alternatively, the function can be also achieved by adding a special optical element for changing the angle of the signal light L3 or the reference light L2 to the optical system. Alternatively, the function can be achieved by mechanically changing a hold angle of the hologram recording medium 200. The angle change operation of the record angle change device 19 is controlled by the control device 18 so as to be part of a series of recording operation as discussed later.

The control device 18 may include a controller comprising a microprocessor and the like, and is adapted to generate and output the control signal S1 in response to the record information and the like to be recorded onto the hologram recording medium 200, control the record angle by controlling the record angle change device 19, supply the record signal Sd corresponding to the record information to the spatial light modulator 15, and control the modulation of the spatial light modulator 15, The hologram recording apparatus 100 is further provided with: a lens 24a for focusing the reproduction light L12 which is based on the reproduction illumination light and which is obtained from the hologram recording medium 200; a photoreceptor 25a for receiving the reproduction light L12 via the lens 24a; and a read device 26a for reading a plurality of record information overlappingly recorded on the hologram recording medium 200, on the basis of the received reproduction light L12, i.e. on the basis of the receive signal Sr outputted from the photoreceptor 25a.

In this embodiment, the reference light L2 can be directly used as the reproduction illumination light by cutting the signal light L1 or L3 before the signal light L1 or L3 reaches the hologram recording medium 200. For example, the signal light L1 or L3 can be shut out by using the spatial light modulator 15 as a shutter for shutting out the signal light L1 under control of the control device 18. Alternatively, it is possible to employ an arrangement for additionally disposing a special optical element in an optical path of the signal light L1 or L3 to shut out the signal light L1 or L3, or an arrangement for selectively inserting a light shield member in an optical path of the signal light L1 or L3.

The photoreceptor 25a for receiving via the lens 24a the reproduction light L12 generated as such may include a photodiode array, a CCD (Charge Coupled Device) and the like.

The read device 26a reads each recorded information by identifying the recorded information corresponding to a light-dark pattern of the received reproduction light L12. Particularly in this embodiment, an angle standard signal Sa is written in the standard angle record plane. The angle standard signal Sa is one example of the identification information for indicating the standard angle record plane corresponding to the standard record angle from among the plurality of the angle record planes on the hologram recording medium 200. The read device 26a can read the angle standard signal Sa from the standard angle record plane. The read device 26a is adapted to read the angle standard signal Sa and then output the read signal Sa to the control device 18.

Particularly in this embodiment, the control device 18 sets, as the standard record angle, a record angle when the first angle record plane is recorded. The first angle record plane is one example of a specific angle record plane of the hologram recording medium 200. After the first angle record plane is recorded, the record angle change device 19 changes and then fixes the record angle by a predetermined angle on the basis of the predetermined standard record angle, under control of the control device 18.

Furthermore, in the case that the hologram recording medium 200 is judged to be unrecorded by existence or inexistence of the angle standard signal Sa from the read device 26a, the control device 18 controls the spatial light modulator 15 so that the first angle record plane is set as the standard angle record plane, and further the angle standard signal Sa for indicating the standard angle record plane corresponding to the standard record angle is recorded to the first angle record plane. Then, on the basis of the angle standard signal Sa, it can be readily recognized that the standard record angle is already set to the hologram recording medium 200. Furthermore, by using the read device 26a, it is readily identified which angle record plane is the standard angle record plane, regardless whether the hologram recording medium 200 to be used for the recording is the same or different, or whether the hologram recording apparatus 100 to be used for the recording is the same or different.

Furthermore, with regard to the hologram recording medium 200 after the record information is recorded onto the first angle record plane, the control device 18 calibrates the record angle change device 19 on the basis of the standard record angle indicated by the angle standard signal Sa. That is, when the first angle record plane is recorded, the first angle record plane is set as the standard angle record plane and the record angle change device 19 is not calibrated. Then, when any other angle record plane is recorded, the record angle change device 19 is calibrated, in response to the standard record angle corresponding to the standard angle record plane indicated by the angle standard signal Sa. More specifically, for example, a difference between the standard record angle corresponding to the standard angle record plane indicated by the angle standard signal Sa and the record angle under a setting condition of the optical system or mechanical state expected to correspond to the standard record angle in the record angle change device 19 at the time point of presently recording is detected. Furthermore, the record angle change device 19 is adapted to change the record angle by offsetting the detected difference of angle.

Furthermore, also in the case that the angle standard signal Sa is recorded onto the hologram recording medium 200 by another hologram recording apparatus from the first, the control device 18 is adapted to calibrate the record angle change device 19 on the basis of the standard record angle indicated by the angle standard signal Sa.

Additionally, the hologram recording apparatus 100 is further provided with a move device 20 for moving the focus position where the signal light L3 and the reference light L2 are focused relative to the surface of the hologram recording medium 200, in a direction along the surface. The move device 20 may move the focus position by changing the angle or position of the optical system such as the lens 16. Alternatively, it may move the focus position by changing the angle or position of another optical system such as the laser device 11, or by additionally disposing a special optical system (e.g. a mirror having variable dispose angles) in optical paths of the signal light L1 or L3 and the reference light L2. Furthermore, it may include a hologram recording medium holding mechanism to move the hologram recording medium 200 itself mechanically in a direction along its surface. The moving by the move device 20 is also controlled by the control signal S2 generated at and outputted from the control device 18, so that the moving is a part of a series of recording as mentioned later.

Next, with reference to FIG. 1, the fundamental recording of the hologram recording apparatus 100 in this embodiment configured as mentioned above is explained.

During its operation, the laser device 11 emits the source light L0, the beam splitter 12 splits the source light L0 into the signal light L1 and the reference light L2. Then, the signal light L1 is regulated into a diameter matched with a size of the spatial light modulator 15 via the lenses 13 and 14, and introduced into the spatial light modulator 15. Then, the spatial light modulator 15, under control of the control device 18, modulates the signal light L1 by a modulation unit of each cell 152, in response to each of a plurality of record information to be recorded. Then, the modulated signal light L3 is focused by the lens 16. Then, the record area of the hologram recording medium 200 is irradiated with the modulated and focused signal light L3 and the reference light L2 reflected at the mirror 17. Then, these lights interfere with each other, so that the record information to be recorded is holographically recorded as a wavefront.

Due to the fundamental recording as mentioned above, the record information is recorded to one angle record plane for one record angle in one record area which is irradiated with the signal light L3 and the reference light L2 at the same time.

Next, the detail of angle-multiplex type record operation of the hologram recording apparatus 100 in this embodiment for performing this recording for a plurality of angle record planes and further for a plurality of record areas will be explained with reference to FIG. 3. FIG. 3 is a flow chart illustrating the record operation.

Figure 3:
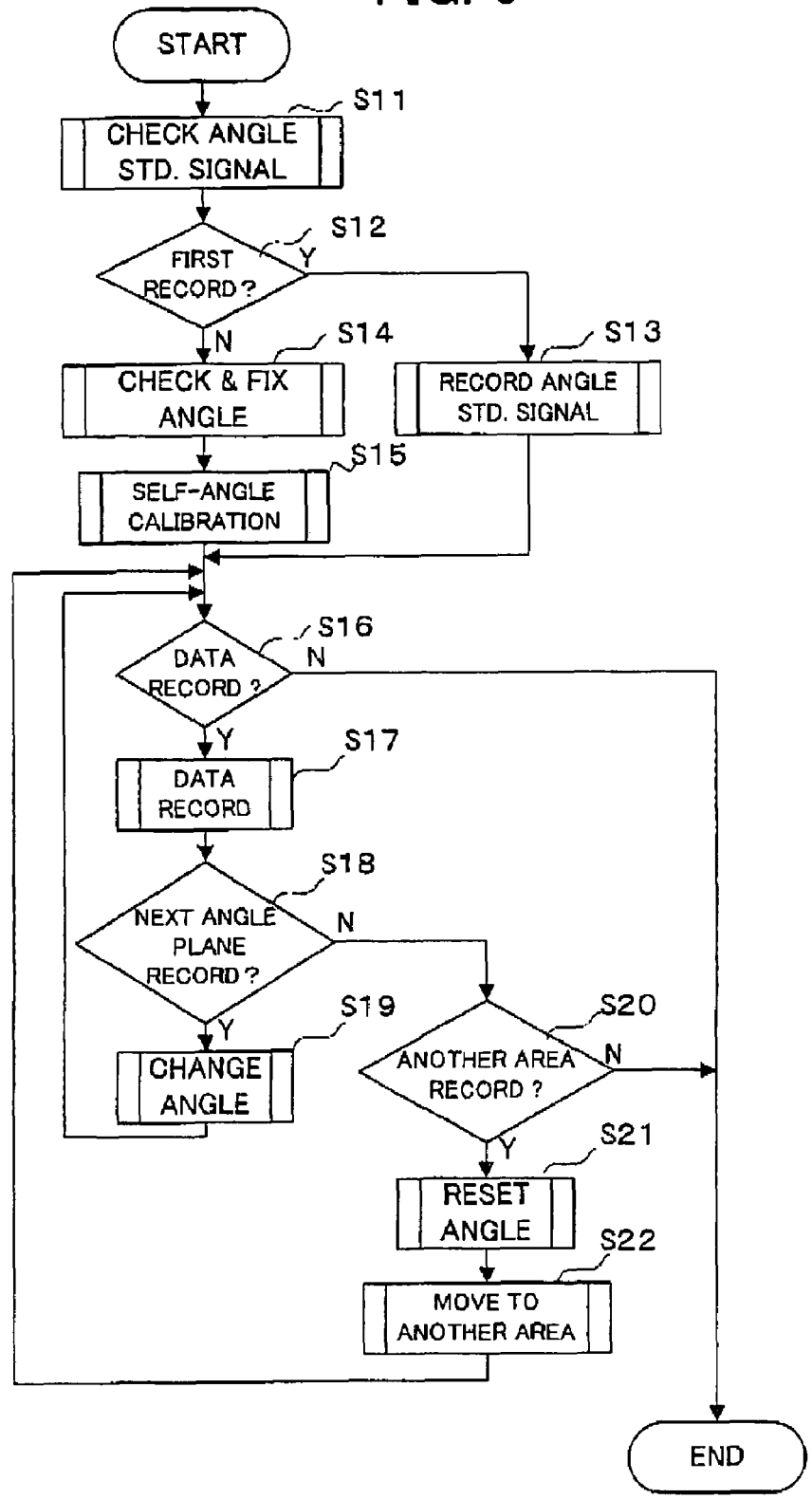
FIG. 3 is a flow chart illustrating the angle-multiplex type record operation in the first embodiment.

In FIG. 3, firstly the signal light L3 is shut out and the reference light L2 is used as the reproduction illumination light, and then the reproduction light L12 is received at the photoreceptor 25a. In response to this, the angle standard signal Sa outputted from the read device 26a is checked by the control device 18 (step S11). Then, depending on the existence or inexistence of the angle standard signal Sa, whether or not it is the first recording relative to the hologram recording medium 200 is judged by the control device 18 (step S12).

At this stage, if it is the first recording (step S12: Yes), the signal light L3 and the reference light L2 are used, and the modulation is performed by the spatial light modulator 15 on the basis of the record signal Sd indicating the angle standard signal Sa so that the angle standard signal Sa is recorded. Since the angle record plane is the standard record plane at this time, the recording is performed to the standard record plane of the hologram recording medium 200 (step S13).

On the other hand, as the result of the judgment at step S12, if it is not the first recording (step S12: No), the current record angle fixed by the record angle change device 19 is checked, and it is recorded into for example a built-in memory of the control device 18 (step S14). Furthermore, the record angle change device 19 is calibrated on the basis of difference between the standard record angle corresponding to the standard angle record plane indicated by the angle standard signal Sa and the current record angle under the fixed state (step S15). This calibration is performed, for example, by offsetting the aforementioned difference of angle in the control signal S1 that is inputted into the record angle change device 19.

Next to processes at steps S13 and S15, the control device 18 judges whether or not the data recording of the record information is to be performed to the current angle record plane fixed by the record angle change device 19 in the current record area (i.e. an area irradiated with the signal light L3 and the reference light L2 at this time) of the hologram recording medium 200 fixed by the move device 20 (step S16).

If the data recording is not to be performed (step S16: No), the process flow ends. That is, in this case, it can be said that checking the angle standard signal Sa (step S11), recording the angle standard signal Sa (step S13) and so on are effectively performed.

On the other hand, as the result of the judgment at step S16, if the data recording is to be performed (step S16: Yes), the irradiation with the signal light L3 and the reference light L2 is performed and the signal light L3 is modulated by the spatial light modulator 15 in response to the record signal Sd, so that the data recording is actually performed (step S17).

Next, the control device 18 judges whether or not the data recording of the record information is to be performed to the next angle record plane changeable by the record angle change device 19 in the current record area of the hologram recording medium 200 fixed by the move device 20 (step S18).

If the data recording is to be performed to the next angle record plane (step S18: Yes), the record angle change device 19 changes the record angle by a predetermined fine angle (e.g. 0.01 degree) under control of the control signal S1 (step S19). In this case, as mentioned above, since the record angle change device 19 is calibrated on the basis of the standard record angle, it is possible to change accurately the record angle. Then, the process flow goes back to step S16 and then repeats the processes after step S16.

On the other hand, as the result of the judgment at step S18, if the data recording is not to be performed to the next angle record plane (step S18: No), the control device 18 judges whether or not the data recording of the record information is to be performed to another record area changeable by the move device 20 (step S20).

If the data recording is to be performed to another record area (step S20: Yes), the record angle change device 19 resets the record angle to be changed and fixed, under control of the control signal S1. That is, the record angle change device 19 changes and fixes the record angle so that the record angle is adapted to the first angle record plane of the next record area (step S21). In this case, as mentioned above, since the record angle change device 19 is calibrated on the basis of the standard record angle, the record angle can be reset accurately, and the record angle can be changed accurately after the reset.

Next, under control of the control signal S2, the move device 20 moves an area, which is irradiated with the signal light L3 and the reference light L2, by a predetermined distance to be another record area (step S22). Then, the process goes back to step S16 to repeat the following processes.

On the other hand, as the result of the judgment at step S20, if the data recording is not to be performed to another record area (step S20: No), a series of recording operations ends.

Thus, the multiplex recordings of the record information to a plurality of angle record planes in a plurality of record areas complete.

As explained above, in this embodiment, the control device 18 sets, as the standard record angle, the record angle for recording the first angle record plane of the hologram recording medium 200. After the first angle record plane is recorded, the record angle change device 19 changes and fixes the record angle by a predetermined fine angle, from the set standard record angle, under control of the control device 18. Therefore, the record angle expected to correspond to the standard record angle defined at the hologram recording apparatus 100 side, i.e. by the set condition or mechanical state of the optical system and the like including the record angle change device 19, the laser device 11, the beam splitter 12, lenses 13, 14 and 16 can be coincided with the standard record angle at the hologram recording medium 200 side, at the first recording. That is, these angles can be coincided with each other, regardless of variations in apparatuses, even in the case that any of the same types and different hologram recording apparatuses 100 is used. Furthermore, after then, on the basis of the standard record angle, any record angle can be recorded onto the angle record plane quickly and accurately.

As explained above, the hologram recording apparatus 100 in this embodiment can perform the angle-multiplex type hologram record. In this embodiment, however, any recorded multiplex information onto the hologram recording medium 200 in the angle-multiplex system can be reproduced using the lens 24a, the photoreceptor 25a and the read device 26a, by shutting out the signal light L1 or L3 and by using the reference light L2 as the reproduction illumination light. That is, in the configuration of the first embodiment shown in FIG. 1, if, on recording and on reproduction, the signal L1 or L3 is shut out, and the reproduction operation the same as the hologram reproduction apparatus mentioned later is performed by the lens 24a, the photoreceptor 25a, the read device 26a and the control device 18, the hologram recording apparatus 100 in this embodiment can be configured as the hologram record and reproduction apparatus capable of performing the recording and reproduction.

In the embodiment mentioned above, the spatial light modulator 15 may binarily modulate the signal light L3 in response to binary data indicated by the record information, or may multilevel-modulate the signal light L3 in response to gray scale data indicated by the record information.

Incidentally, a material for the hologram recording medium may be a known inorganic material or organic material (polymer material). Furthermore, the hologram recording medium may be in a form of card-like medium, or a disc-like medium.

Second Embodiment of Hologram Recording Apparatus

Figure 4:
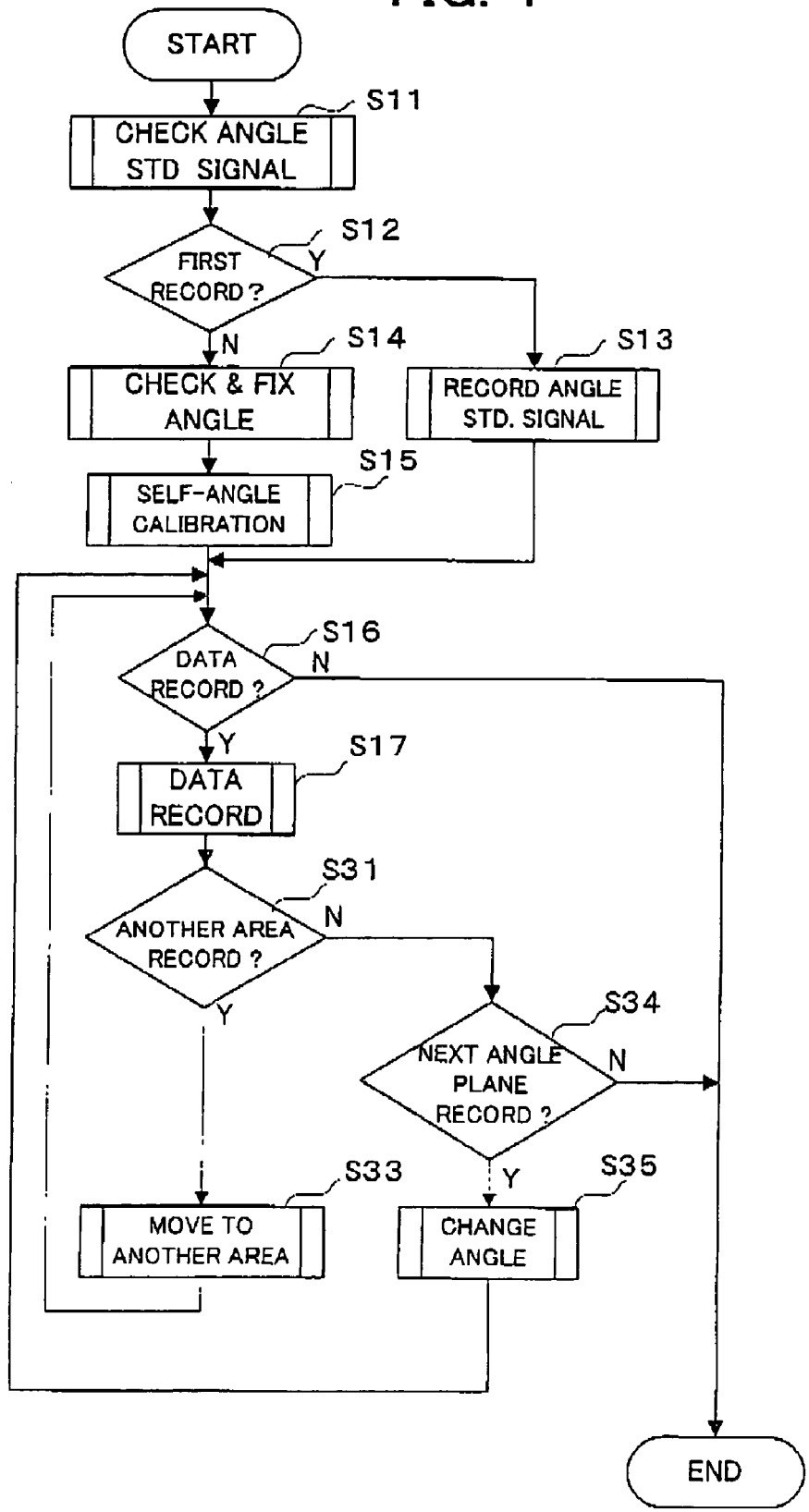
FIG. 4 is a flow chart illustrating the angle-multiplex type record operation in the second embodiment of the hologram recording apparatus of the present invention.

The second embodiment of the hologram recording apparatus according to the present invention will be discussed, with reference to FIG. 4. FIG. 4 is a flow chart illustrating the record operation of the hologram recording apparatus in the second embodiment.

In the second embodiment, the timing in changing the angle record plane and changing the record area is different from that of the first embodiment, and other constructions and operations are the same as those of the first embodiment. Therefore, in the flow chart of FIG. 4, the same steps as those of FIG. 3 carry the same numerals, and the explanation about them are omitted as appropriate.

Firstly in FIG. 4, the processings from step S11 to step S17 are performed similarly to the first embodiment shown in FIG. 3.

After completing the step S17, the control device 18 judges whether or not the data recording for the record information is to be performed to another record area accessible by the move device 20 (step S31).

If the data recording is to be performed to another record area (step S31: Yes), under control of the control signal S2, the move device 20 moves an area, which is irradiated with the signal light L3 and the reference light L2, by a predetermined distance to be another record area (step S33). Then, the process goes back to step S16 to repeat the following processes.

On the other hand, as the judgement at step S31, if the data recording is not to be performed relative to another record area (step S20: No), the control device 18 judges whether or not the data recording for the record information is to be performed to the next angle record plane changeable by the record angle change device 19 in the record area at the present time point of the hologram recording medium 200 fixed by the move device 20 (step S34).

If the data recording is to be performed to the next angle record plane (step S34: Yes), under control of the control signal S1, the record angle change device 19 changes the record angle by a predetermined fine angle (e.g. 0.01 degree) (step S35). In this case, as mentioned above, since the record angle change device 19 is calibrated on the basis of the standard record angle, the record angle can be changed accurately. Then, the process goes back to step S16 to repeat the following processes.

On the other hand, as the result at the judgement at step S34, if the data recording is not to be performed to the next angle record plane (step S34: No), a series of record processes ends.

Thus, the multiplex-recordings of the record information to a plurality of angle record planes in a plurality of record areas are completed.

As explained above, in this embodiment, the control device 18 sets, as the standard record angle, the record angle when the first angle record plane is recorded for the hologram recording medium 200. After the first angle record plane is recorded, the record angle change device 19 changes and fixes the record angle, by a predetermined fine angle, from the set standard record angle, under control of the control device 18. Therefore, similarly to the case of the first embodiment, the record angle expected to correspond to the standard record angle defined by the set condition or the mechanical state at the hologram recording apparatus 100 side can be coincided with the standard record angle at the hologram recording medium 200 side.

(Modification in Hologram Recording Apparatus)

Incidentally, in each embodiment mentioned above, it is possible to integrate a reference light phase-code-multiplex type system for performing multiplex-recordings with various phases of the reference light L2, with the angle-multiplex system in the above-mentioned embodiments. In this case, for example, an optical element for changing the phase may be disposed in the optical path of the reference light L2 to change the phase of the reference light L2, so that the hologram recording is performed overlappingly to the same record area for each phase, similarly to the above case.

Furthermore, instead of or in addition to such a reference light phase-code-multiplex type recording, it is possible to integrate a reference light amplitude-multiplex system for performing multiplex-recordings with various amplitudes of the reference light L2. In this case, for example, an optical element for changing the amplitude may be disposed in the optical path of the reference light L2 to change the amplitude of the reference light L2, so that the hologram recording is performed overlappingly to the same record area for each amplitude.

Furthermore, instead of or in addition to these reference light phase-code-multiplex type recording or reference light amplitude-multiplex type recording, it is possible to integrate a reference light polarization-multiplex system for performing multiplex-recordings with various polarizations of the reference light L2, with the angle-multiplex system in the above-mentioned embodiments. In this case, for example, an optical element for changing the polarization may be disposed in the optical path of the reference light L2 to change the polarization of the reference light L2, so that the hologram recording is performed overlappingly to the same record area for each polarization, similarly to the above cases.

Furthermore, instead of or in addition to these reference light phase-code-multiplex system, reference light amplitude-multiplex system or reference light polarization-multiplex system, it is possible to integrate a focal-depth-multiplex system for performing a multiplex-recording with various focal depths of the signal light L3, with the angle-multiplex system in the above-mentioned embodiments. In this case, for example, an optical element for changing the focal depth may be added, or positions of optical elements such as lenses 13, 14, 16 or the laser device 11 may be changed, or a mechanical element for changing the position of the hologram recording medium 200 may be added, to change the focal depth, so that the hologram recording is performed overlappingly to the same record area for each focal depth, similarly to the above cases.

According to these modifications, comparing to the aforementioned embodiments, the hologram recording can be performed with higher density.

Embodiments of Hologram Reproduction Apparatus

Embodiments of the hologram reproduction apparatus according to the present invention will be discussed, with reference to FIG. 5 and FIG. 6.

Firstly, with reference to FIG. 5, an entire construction of the hologram reproduction apparatus in this embodiment will be discussed. FIG. 5 illustrates the entire construction of the hologram reproduction apparatus in this embodiment.

The hologram reproduction apparatus 300 in this embodiment is for reading the recorded information from the hologram recording medium 200 recorded by the hologram recording apparatus 100 in the aforementioned embodiments.

Figure 5:
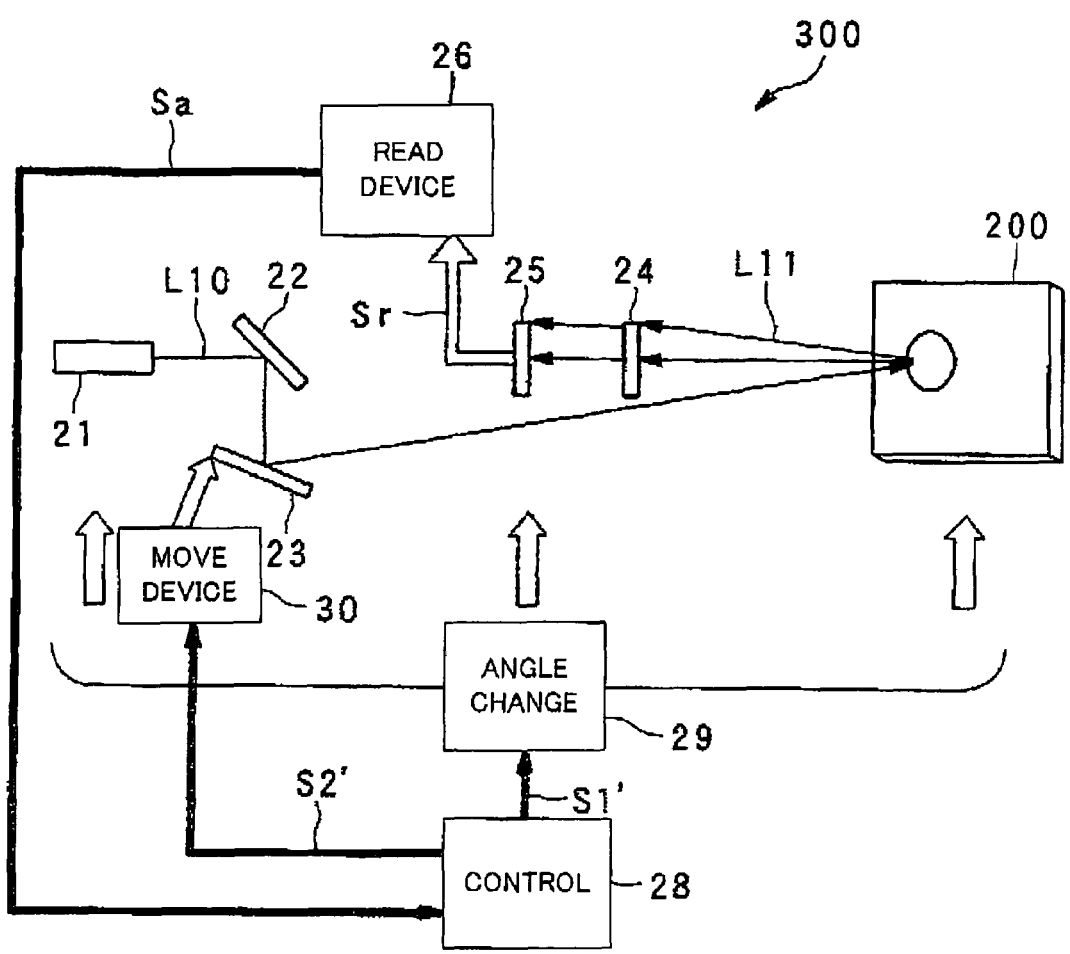
FIG. 5 is a block diagram illustrating an entire configuration of an embodiment of the hologram reproduction apparatus of the present invention.

As shown in FIG. 5, the hologram reproduction apparatus 300 is provided with: a laser device 21 as an example of the light source such as a semiconductor laser for irradiating reproduction illumination light L10 onto the hologram recording medium 200; mirrors 22 and 23 for introducing the reproduction illumination light L10 to the hologram recording medium 200; a lens 24 for focusing reproduction light L11 based on the reproduction illumination light; a photoreceptor 25 for receiving the reproduction light L11 via the lens 24; a read device 26 for reading the recorded information recorded onto the hologram recording medium 200 on the basis of the received signal Sr outputted from the photoreceptor 25 in response to the received reproduction light L11.

The hologram reproduction apparatus 300 is further provided with: a reproduction angle change device 29 for changing little by little and fixing the angles of the reproduction illumination light L10 relative to the surface of the hologram recording medium 200; and a control device 28 for controlling the reproduction angle change device 29 so that the reproduction illumination light L10 has the reproduction angle corresponding to the angle record plane where the reproduction is performed on the hologram recording medium 200. Incidentally, in this embodiment, an angle formed by an optical axis of the reproduction illumination light L10 and the surface of the hologram recording medium 200 is defined as a "reproduction angle".

The reproduction angle change device 29 has the function of changing relatively the reproduction angle of the reproduction illumination light L10 relative to the surface of the hologram recording medium 200. The function can be achieved, for example, by changing the angles or positions of the constitutional elements in the optical system, such as the laser device 21; the mirrors 22 and 23, relative to each optical axis. Alternatively, the function can be achieved by adding a special optical element for changing the angle of the reproduction illumination light L10 relative to this optical system. Alternatively, the function can be achieved by mechanically changing a hold angle of the hologram recording medium 200. The angle change operation of the reproduction angle change device 29 is controlled by the control device 28, so that it becomes a part of a series of reproduction as discussed later.

The control device 28 may include a controller comprising a microprocessor and the like, and is adapted to generate and output the control signal S1' in response to the recorded information and the like to be reproduced from the hologram recording medium 200, and control the reproduction angle with the reproduction angle change device 29.

The photoreceptor 25 for receiving the reproduction light L11 generated as such via the lens 24 may include the photodiode array, the CCD and so on.

The read device 26 preferably stores into the memory a table of relationship between the light-dark pattern received at the photoreceptor 25 and a plurality of recorded information values modulated by a cell unit by the spatial light modulator 15 (see FIG. 1) when recording the hologram recording medium 200. Then, each recorded information is read by identifying the light-dark pattern of the received reproduction light L11 and by identifying the recorded information corresponding to the identified light-dark pattern with reference to this table. Therefore, a plurality of record information recorded on one angle record plane in one record area can be read at the same time.

Particularly in this embodiment, the read device 26 can read the angle standard signal Sa from the standard angle record plane where the angle standard signal Sa is written from among a plurality of angle record planes on the hologram recording medium 200. Then, after reading the angle standard signal Sa, the read device 26 outputs it to the control device 28.

The control device 28 can readily identify which angle record plane is the standard record plane on the basis of the angle standard signal Sa, regardless of whether the hologram recording medium 200 to be used for the reproduction is the same or different, or whether the hologram reproduction apparatus 300 to be used for the reproduction is the same or different.

Furthermore, the control device 28 calibrates the reproduction angle change device 29 on the basis of the standard record angle indicated by the angle standard signal Sa. That is, on reproduction any angle record plane, the reproduction angle change device 29 is firstly calibrated in response to the standard reproduction angle corresponding to the standard angle record plane indicated by the angle standard signal Sa. More specifically, for example, a difference between the standard reproduction angle corresponding to the standard angle record plane indicated by the angle standard signal Sa and the reproduction angle under a setting condition of the optical system or mechanical state expected to correspond to the standard reproduction angle in the reproduction angle change device 29 at the time point of presently reproduction is detected. Furthermore, the reproduction angle change device 29 is adapted to change the reproduction angle by offsetting the detected difference of angle.

Additionally, the hologram reproduction apparatus 800 is further provided with; a move apparatus 30 for moving the focus position where the reproduction illumination light L10 is focused relative to the surface of the hologram recording medium 200 in a direction along its surface.

The move device 30 may move the focus position of the reproduction illumination light L10 by changing the angle or position of the optical system such as the mirrors 22 and 23, for example. Alternatively, the focus position may be moved by changing the angle or position of another optical system such as the laser device 21, or by additionally disposing a special optical system (e.g. a mirror having a variable set angle) in an optical path of the reproduction illumination light L10. Furthermore, a hold mechanism for holding the hologram recording medium 200 may be employed to move the hologram recording medium 200 itself mechanically in a direction along its surface. Also the moving by the move device 30 is controlled by the control signal S2' generated at and outputted from the control device 28, so that it becomes a part of a series of reproduction operations mentioned later.

Next, with reference to FIG. 6, the fundamental reproduction operation of the hologram reproduction apparatus 300 in this embodiment constructed as such will be explained.

During its operation, the laser device 21 irradiates the hologram recording medium 200 with the reproduction illumination light L10 via the mirrors 22 and 23. Then, the photoreceptor 25 receives the reproduction light L11 based on the reproduction illumination light L10 for the hologram recording medium 200. The reproduction light L11 may be the 0th-order light or the higher order light such as the 1st-order light generated when the hologram recording medium 200 is irradiated with the reproduction illumination light L10 corresponding to the reference light of recording. Due to the property of the hologram recording, the reproduction light L11 has the light-dark pattern the same as that of the modulated signal light L3 shown in FIG. 1.

Next, on the basis of the reproduction light L11 received at the photoreceptor 25, each record information recorded onto the hologram recording medium 200 subjected to the high density recording as mentioned above is reproduced by the read device 26.

Owing to the fundamental reproduction, the recorded information to one angle record plane for one reproduction angle in one record area irradiated with the reproduction illumination light L10 at one time is reproduced.

Next, the angle-multiplex type reproduction operations of the hologram reproduction apparatus 300 in this embodiment for performing such a reproduction for a plurality of angle record planes and further for a plurality of record areas will be explained with reference to FIG. 6. FIG. 6 illustrates the record operation in a flow chart.

Figure 6:
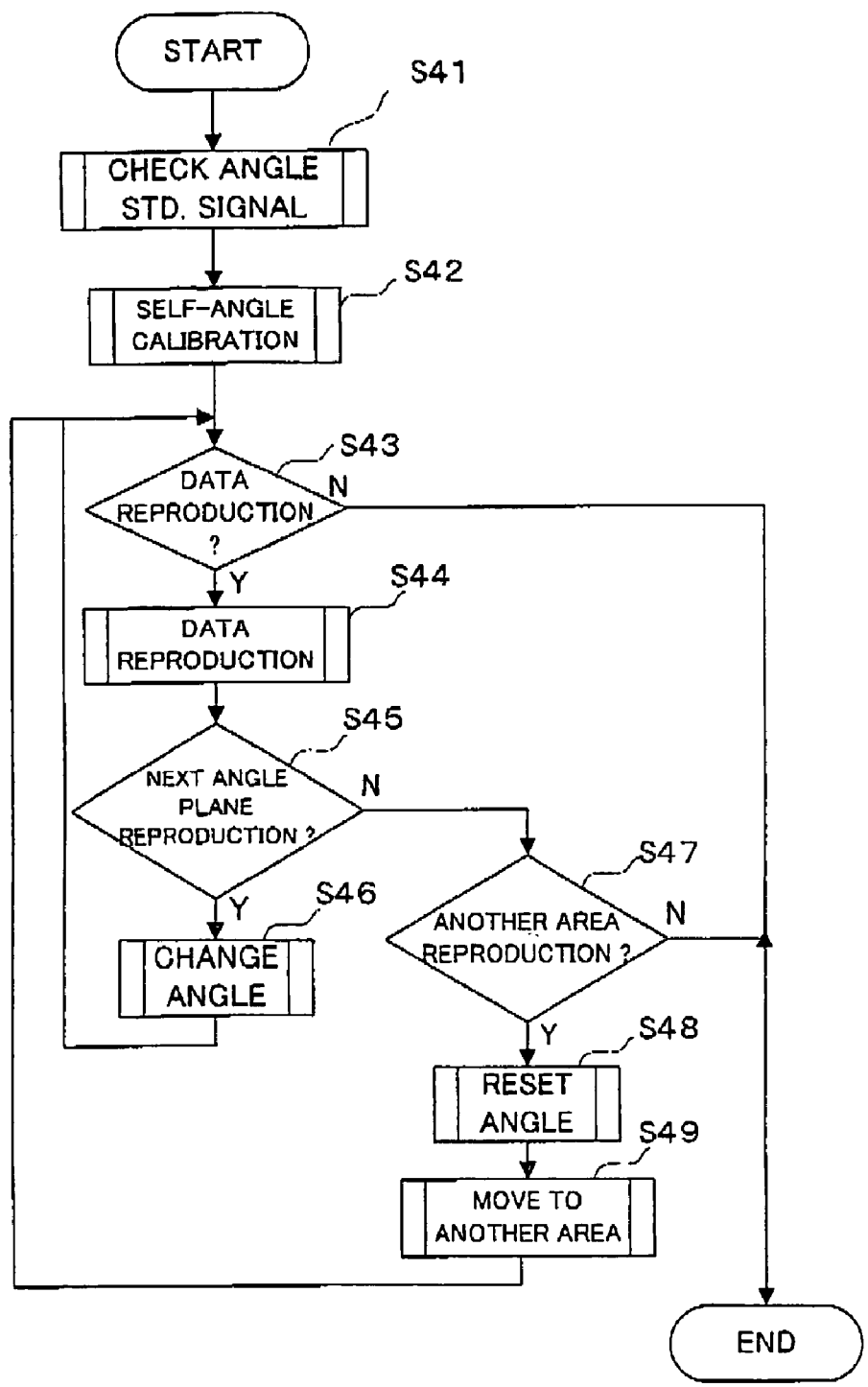
FIG. 6 is a flow chart illustrating the angle-multiplex type reproduction operation in an embodiment of hologram reproduction apparatus of the present invention.

In FIG. 6, the reproduction light L11 based on the reproduction illumination light L10 is firstly received at the photoreceptor 25. In response to this, the angle standard signal Sa outputted from the read device 26 is checked by the control device 28 (step S41). Then, the reproduction angle change device 29 is calibrated on the basis of the difference between the current reproduction angle fixed by the reproduction angle change device 29 and the standard reproduction angle corresponding to the standard angle record plane indicated by the angle standard signal Sa (step S42). This calibration is performed by offsetting the aforementioned difference of angle in the control signal S1' that may be inputted into the reproduction angle change device 29.

Next, the control device 28 judges whether or not the data reproduction is to be performed to the current angle record plane fixed by the reproduction angle change apparatus 29 in the current record area of the hologram recording medium 200 fixed by the move device 30 (step S43).

If the data reproduction is not to be performed (step S43: No), the process flow ends. That is, in this case, it can be said that checking the angle standard signal Sa (step S41) and so on is effectively performed.

On the other hand, as the result of the judgment at step S43, if the data reproduction is to be performed (step S43: yes), the irradiation with the reproduction illumination light L10 is performed, and the photoreceptor 25, the read device 26 and the like perform actually the data reproduction (step S44).

Next, the control device 28 judges whether or not the data reproduction of the recorded information is to be performed to the next angle record plane changeable by the reproduction angle change apparatus 29 in the current record area of the hologram recording medium 200 fixed by the move device 30 (step S45).

If the data reproduction is to be performed to the next angle record plane (step S45: Yes), the reproduction angle change device 29 changes the reproduction angle by a predetermined fine angle (e.g. 0.01 degree) under control of the control signal S1' (step S46). In this case, as mentioned above, since the reproduction angle change device 29 is calibrated on the basis of the standard reproduction angle, it is possible to change accurately the reproduction angle. Then, the process flow goes back to step S43 to repeat the following processings.

On the other hand, as the result of the judgment at step S45, if the data reproduction is not to be performed to the next angle record plane (step S45: No), the control device 28 judges whether or not the data reproduction of the recorded information is to be performed to another record area changeable by the move device 30 (step S47).

If the data reproduction is to be performed to another record area (step S47: Yes), under control of the control signal S1', the reproduction angle to be changed and fixed by the reproduction angle change device 29 is reset. That is, the reproduction angle change device 29 changes and fixes the reproduction angle to make it correspond to the first angle record plane in the next record area (step S48). In this case, as mentioned above, since the reproduction angle change device 29 is calibrated on the basis of the standard reproduction angle, the reproduction angle can be reset accurately. Furthermore, the reproduction angle after reset can be changed accurately.

Next, under control of the control signal S2', the move device 30 moves, the area onto which the reproduction illumination light L10 is irradiated, by a predetermined distance to be another record area (step S49). Then, the process goes back to step S16 to repeat the following processes.

On the other hand, as the result of the judgment at step S47, if the data reproduction is not to be performed to another record area (step S47: No), a series of reproduction processings ends.

Thus, the reproductions of the recorded information to a plurality of angle record planes in a plurality of record areas complete.

As explained above, in this embodiment, under control of the control device 28, the reproduction angle change device 29 changes and fixes the reproduction angle by a predetermined fine angle on the basis of the standard reproduction angle corresponding to the standard angle record plane indicated by the angle standard signal Sa. Therefore, it is possible to coincide the reproduction angle expected to correspond to the standard reproduction angle defined at the hologram reproduction apparatus 300 side, i.e. defined by the set condition or the mechanical state of the optical system or the like including mirrors 22 and 23, the laser device 21 and the reproduction angle change device 29, with the standard reproduction angle at the hologram recording medium 200 side. That is, even in the case that any different hologram reproduction apparatus 300 of the same type is used, these angles can be coincided with each other regardless of variations among apparatuses. Furthermore, after then, on the basis of the standard reproduction angle, the reproduction can be performed for any reproduction angle quickly and accurately from the angle record plane.

As discussed above, according to the hologram recording apparatus and method, as well as the hologram reproduction apparatus and method, of the present invention, it is possible to improve the record density and the record capacity, and further to perform the recording or the reproduction accurately and quickly.

The present invention is not limited to the aforementioned embodiments, and may be modified within a range not departing from the essence or spirit of the invention read from the whole specification and the claims. Such a modified hologram recording apparatus and method, as well as such a modified hologram reproduction apparatus and method, are all encompassed within a technical scope of the present invention.

INDUSTRIAL APPLICABILITY

The hologram recording apparatus and method, as well as the hologram reproduction apparatus and method, according to the present invention are applicable to various recording apparatus and method for recording, with high density, various contents information such as video information and audio information, various data information for computers, a large volume of information such as control information, by irradiating a downsizable hologram recording medium with signal light, or also applicable to various reproduction apparatus and method for reproducing the large volume of information recorded with high density from a downsizable hologram recording medium, by irradiating the downsizable hologram recording medium with the reproduction light.

The invention claimed is:

1. An angle-multiplex type hologram recording apparatus comprising:
    a light source for performing an irradiation with source light including signal light and reference light;
    a spatial light modulator disposed in an optical path of the signal light, for modulating the signal light;
    an optical system for introducing the signal light passed through the spatial light modulator and the reference light onto a hologram recording medium;
    a record angle change device for relatively changing a record angle of the hologram recording medium relative to the signal light and the reference light; and
    a control device for controlling the record angle change device to set the record angle when a specific angle record plane is recorded from among a plurality of angle record planes on the hologram recording medium as a standard record angle, and to change and fix the record angle after then by a predetermined angle from the set standard record angle.

2. The angle-multiplex type hologram recording apparatus according to claim 1, wherein the spatial light modulator records angle standard identification information indicating a standard angle record plane corresponding to the standard record angle onto the specific angle record plane, if the hologram recording medium is not recorded.

3. The angle-multiplex type hologram recording apparatus according to claim 2, wherein the control device calibrates the record angle change device on the basis of the angle standard identification information, if record information has been recorded at least on the specific angle record plane of the hologram recording medium.

4. The angle-multiplex type hologram recording apparatus according to claim 1, wherein angle standard identification information indicating standard angle record plane corresponding to the standard record angle is recorded onto at least one of a plurality of angle record planes of the hologram recording medium, and
    the control device calibrates the record angle change device on the basis of the angle standard identification information.

5. The angle-multiplex type hologram recording apparatus according to claim 1, further comprising a move device for moving the hologram recording medium relative to a focus position of the reference light and the signal light introduced by the optical system.

6. The angle-multiplex type hologram recording apparatus according to claim 5, wherein the spatial light modulator performs recording to all angle record planes of the hologram recording medium every time of moving by the move device.

7. The angle-multiplex type hologram recording apparatus according to claim 1, wherein the specific angle record plane is an angle record plane to be firstly recorded from among the plurality of angle record planes.

8. An angle-multiplex type hologram reproduction apparatus for reproducing recorded information from an angle-multiplex type hologram recording medium in which angle standard identification information indicating a standard angle record plane is recorded onto one of a plurality of angle record planes, said reproduction apparatus comprising:
    a light source for irradiating the hologram recording medium with reproduction illumination light;

a photoreceptor for receiving reproduction light based on the reproduction illumination light from the hologram recording medium;

a read device for reading respectively the plurality of recorded information overlappingly recorded onto the hologram recording medium, on the basis of the received reproduction light;

a reproduction angle change device for changing a reproduction angle of the hologram recording medium relative to the reproduction illumination light; and a control device for controlling the reproduction angle change device so as to change and fix the reproduction angle by a predetermined angle on the basis of standard reproduction angle corresponding to the standard angle record plane, wherein the control device calibrates the reproduction angle change device on the basis of the angle standard identification information.

9. The angle-multiplex type hologram reproduction apparatus according to claim 8, further comprising: a move device for moving the hologram recording medium relative to a focus position of the reproduction illumination light.

10. The angle-multiplex type hologram reproduction apparatus according to claim 9, wherein the read device performs reproduction to all angle record planes of the hologram recording medium, every time of moving by the move device.

11. An angle-multiplex type hologram recording method in an angle-multiplex type hologram recording apparatus comprising: a light source for performing an irradiation with source light including signal light and reference light; a spatial light modulator disposed in an optical path of the signal light, for modulating the signal light; an optical system for introducing the signal light passed through the spatial light modulator and the reference light onto the hologram recording medium; and a record angle change device for relatively changing a record angle of the hologram recording medium relative to the signal light and the reference light, said method comprising:

a set process of setting the record angle when a specific angle record plane from among a plurality of angle record planes of the hologram recording medium is recorded, as a standard record angle; and a control process of controlling the record angle change device so as to change and fix the record angle after then by a predetermined angle from the set standard record angle.

12. The angle-multiplex type hologram recording method according to claim 11, wherein the specific angle record plane is an angle record plane to be firstly recorded from among the plurality of angle record planes.

13. An angle-multiplex type hologram reproduction method in an angle-multiplex type hologram reproduction apparatus for reproducing the recorded information from the angle-multiplex type hologram recording medium in which angle standard identification information indicating a standard angle record plane is recorded onto one of a plurality of angle record planes, said reproduction apparatus comprising: a light source for irradiating the hologram recording medium with reproduction illumination light; a photoreceptor for receiving reproduction light based on the reproduction illumination light from the hologram recording medium; a read device for reading respectively the plurality of recorded information overlappingly recorded onto the hologram recording medium, on the basis of the received reproduction light; and a reproduction angle change device for changing a reproduction angle of the hologram recording medium relative to the reproduction illumination light, said method comprising:

a calibration process of calibrating the reproduction angle change device on the basis of the angle standard identification information; and a control process of controlling the reproduction angle change device so as to change and fix the reproduction angle by a predetermined angle on the basis of standard reproduction angle corresponding to the standard angle record plane.

* * * * *